United States Patent
Berkcan et al.

(10) Patent No.: US 7,705,583 B2
(45) Date of Patent: Apr. 27, 2010

(54) MICRO-ELECTROMECHANICAL SYSTEM (MEMS) BASED CURRENT AND MAGNETIC FIELD SENSOR

(75) Inventors: Ertugrul Berkcan, Clifton Park, NY (US); Shankar Chandrasekaran, Chennai (IN)

(73) Assignee: General Electric Company, Niskayuna, NY (US)

( * ) Notice: Subject to any disclaimer, the term of this patent is extended or adjusted under 35 U.S.C. 154(b) by 1 day.

(21) Appl. No.: 12/251,896

(22) Filed: Oct. 15, 2008

(65) Prior Publication Data
US 2009/0033314 A1 Feb. 5, 2009

Related U.S. Application Data

(62) Division of application No. 11/356,332, filed on Feb. 16, 2006, now Pat. No. 7,453,256.

(51) Int. Cl.
*G01R 31/00* (2006.01)
(52) U.S. Cl. .................................. 324/117 R; 324/126
(58) Field of Classification Search .................... None
See application file for complete search history.

(56) References Cited

U.S. PATENT DOCUMENTS

| 6,215,318 B1 * | 4/2001 | Schoefthaler et al. ....... 324/658 |
| 6,617,750 B2 * | 9/2003 | Dummermuth et al. ..... 310/309 |
| 2004/0158439 A1 * | 8/2004 | Kim et al. ................... 702/190 |

* cited by examiner

*Primary Examiner*—Minh N Tang
(74) *Attorney, Agent, or Firm*—Paul J. DiConza

(57) ABSTRACT

A micro-electromechanical system (MEMS) current and magnetic field sensor for sensing a magnetic field produced by a conductor includes a magneto-MEMS component for sensing the magnetic field and an interference-MEMS component for sensing an interference, wherein the magneto-MEMS component and the interference MEMS component are used to provide an indication of the current in the conductor.

19 Claims, 5 Drawing Sheets

MICRO-ELECTROMECHANICAL SYSTEM (MEMS) BASED CURRENT AND MAGNETIC FIELD SENSOR

This application is a divisional of application Ser. No. 11/356,332, filed Feb. 16, 2006, now U.S. Pat. No. 7,453,256, which is hereby incorporated by reference in its entirety.

BACKGROUND

The present disclosure relates generally to electrical current and magnetic field sensing devices. More particularly, the present disclosure relates to a micro-electromechanical system (MEMS)-based current and magnetic field sensor.

A current carrying conductor produces a magnetic field in the vicinity of the current carrying conductor. The magnetic field produced by the current carrying conductor can induce a force on another current carrying conductor disposed in the magnetic field produced by that current carrying conductor. As such, one approach used to sense electrical current involves the use of a sensor that measures the magnetic field induced by current flowing in a current carrying conductor. Since the generated magnetic field is proportional to the current flowing in the current carrying conductor, such a sensor can use the magnitude of the magnetic field to determine the current.

From a safety perspective, current sensors that use magnetic fields to measure electrical current are well suited for high voltage applications because they do not have to contact the high voltage circuitry. However, there are several disadvantages associated with existing current sensors that use magnetic fields to measure electrical current in high voltage applications. For example, existing current sensors tend to have a large form factor because they require a thick conductor that can withstand the varying levels of current flow that can be experienced. Additionally, the current flow induces heating, which reduces the efficiency and accuracy of the current sensors. Since existing current sensors are large and bulky, their physical and electrical operating characteristics have prevented their use in smaller scale environments.

Recently, micro-electromechanical systems have been utilized as current sensors. However, many of theses micro-electromechanical system current sensors are susceptible to environmental factors that impact their accuracy.

There accordingly remains a need in the art for a MEMS-based magnetic filed sensor capable of producing accurate readings in an environment that includes interference.

SUMMARY

Exemplary embodiments include a micro-electromechanical system (MEMS) current and magnetic field sensor for sensing a magnetic field produced by a conductor including a magneto-MEMS component for sensing the magnetic field and an interference-MEMS component for sensing an interference, wherein the magneto-MEMS component and the interference MEMS component are configured to provide an unprocessed indication of the magnetic field.

Exemplary embodiments also include a micro-electromechanical system (MEMS) current and magnetic field sensor for sensing a magnetic field produced by a current carrying conductor, including a first structural component, a magnetic-to-mechanical converter in operable communication with the first structural component for providing a mechanical indication of the magnetic field, a second structural component, a interference-to-mechanical converter in operable communication with the second structural components for providing a mechanical indication of an interference, a first mechanical sense component for sensing the mechanical indication from the magnetic-to-mechanical converter based at least in part upon a change in capacitance, a second mechanical sense component for sensing the mechanical indication from the interference-to-mechanical converter, and a mechanical change-to-electrical converter in operable communication with the interference-to-mechanical converter and the magnetic-to-mechanical converter for providing an indication of the current in the current carrying conductor.

Other exemplary embodiments include a micro-electromechanical system (MEMS) current and magnetic field sensor including: a magneto-MEMS component for sensing a magnetic field and a concurrent interference measurand; an interference-MEMS component for separately sensing the concurrent interference measurand; and a readout component coupled to the magneto-MEMS component and the interference-MEMS component to synchronously receive indications of the magnetic field and the interference measurand and to provide an indication of the magnetic field absent the concurrent interference measurand.

Further exemplary embodiments include a method of measuring a current in a conductor, including measuring a magnetic field and an interference with a magneto-MEMS component, generating an first electrical signal indicative of the magnetic field and the interference, measuring the interference with a interference MEMS component, generating an second electrical signal indicative of the interference, and determining the current in the conductor with an output stage responsive to the first and second electrical signals.

Other systems, methods, and/or computer program products according to exemplary embodiments will be or become apparent to one with skill in the art upon review of the following drawings and detailed description. It is intended that all such additional systems, methods, and/or computer program products be included within this description, be within the scope of the present disclosure, and be protected by the accompanying claims.

The above described and other features are exemplified by the following figures and detailed description.

BRIEF DESCRIPTION OF THE DRAWINGS

Referring now to the figures, which are exemplary embodiments and wherein the like elements are numbered alike.

DETAILED DESCRIPTION

Figure 1:
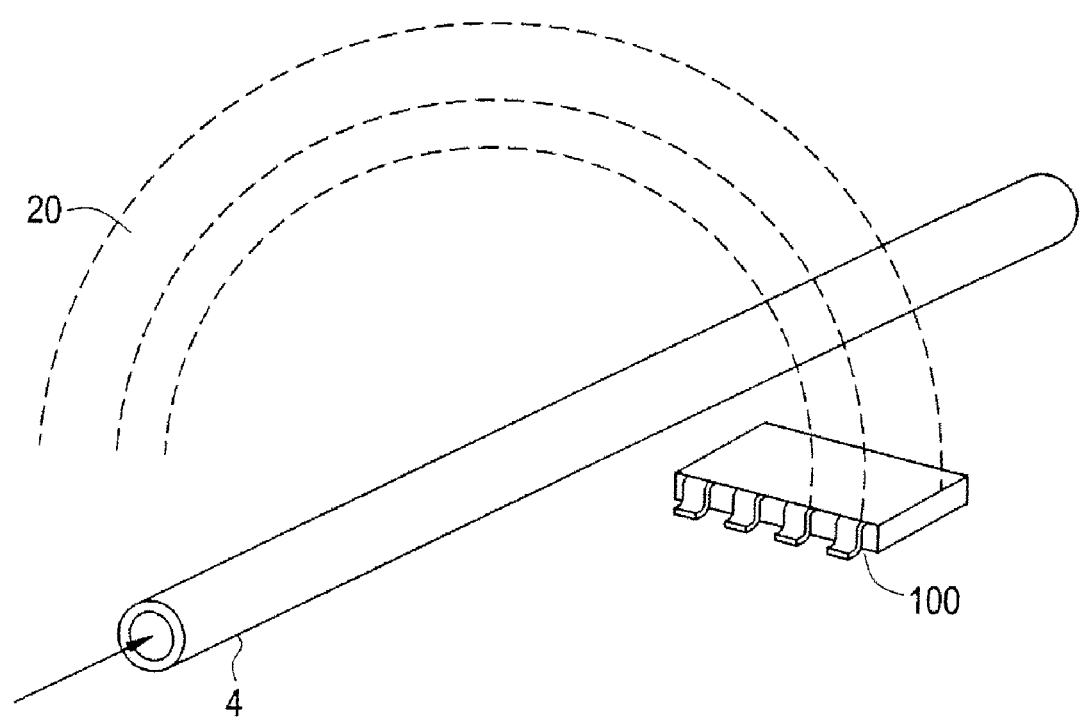
FIG. 1 is a depiction of a MEMS-based current sensor and current carrying conductor.

With reference to FIG. 1, there is shown a schematic diagram representative of a MEMS-based current sensor in accordance with the disclosure herein, generally represented by reference numeral 100. The MEMS-based current sensor 100 uses, for example, a force between current carrying conductors, or a mutual inductance induced between terminals of a second conductor in a magnetic field, to sense (i.e., detect) and determine characteristics (e.g., magnitude and direction) of a current I in a first current carrying conductor. In case the terminals of this conductor are shorted together, this mutually inductive coupling results in a back electromotive force due to the Lenz law.

Figure 2:
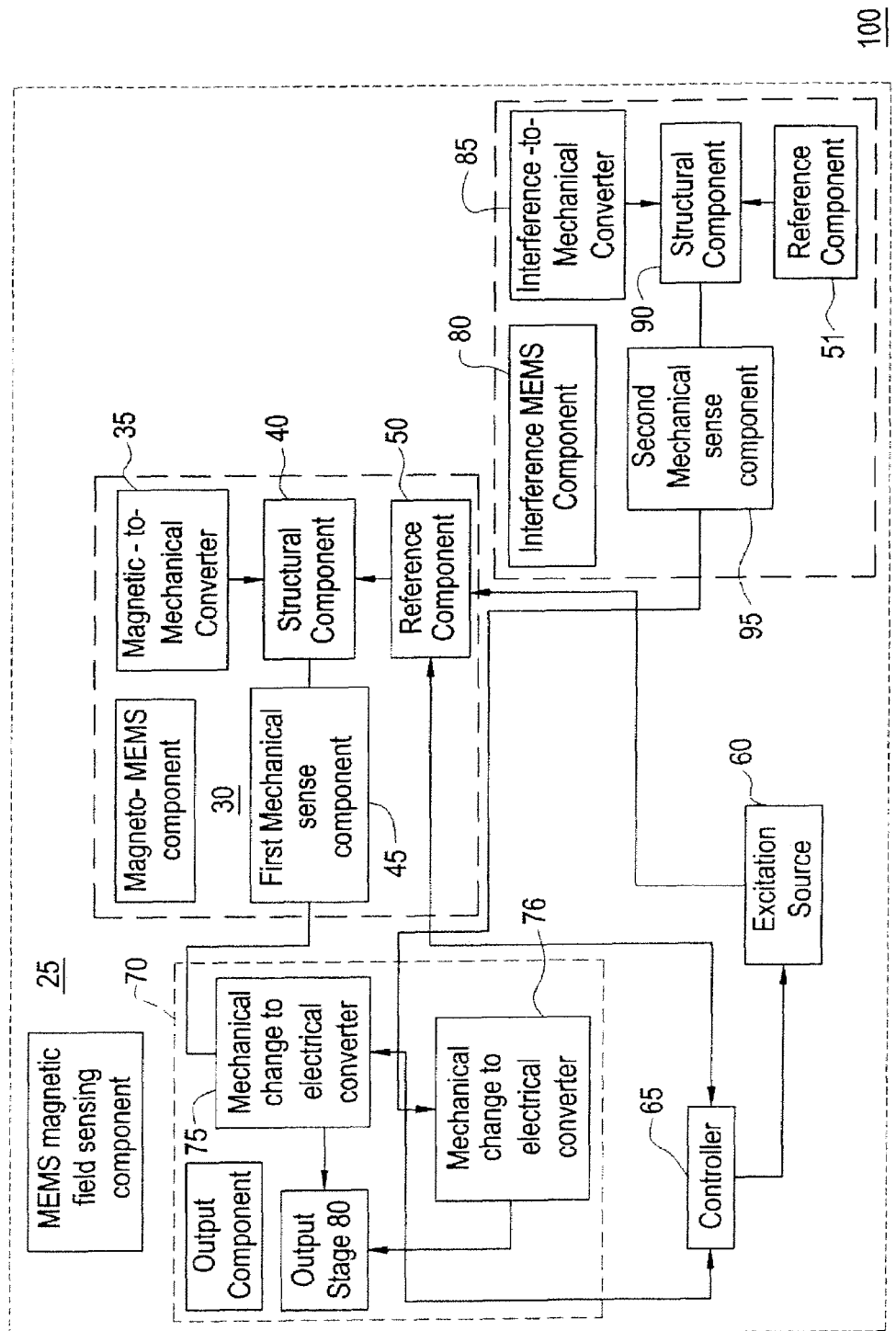
FIG. 2 is a schematic diagram representative of a MEMS-based current sensor as shown in FIG. 1 constructed in accordance with one embodiment.

In general, the method of sensing the current in the first current carrying conductor includes a process of magnetic field sensing by a MEMS-based current sensor 100 (e.g., as shown in FIG. 2). The MEMS-based current sensor 100 is specifically implemented using MEMS devices to provide a current sensor that is highly accurate, reliable, robust, and that introduces minimal or no error in the current being sensed. Advantageously, in contrast to the prior art, the method does not require any processing of the output of the MEMS components to provide the indication of the magnetic field (e.g., the method contemporaneously measure a magnetic field and an interference and produces an indication of the magnetic field without the use of a processor). Prior art magnetic filed sensors have typically take two consecutive measurements, one of the magnetic field and one of the interference, and used a processor to produce an indication of the magnetic field. Typically, the delay between the consecutive measurements would range from approximately 100 microseconds (µs) to approximately 1 millisecond. As used herein contemporaneously means within at most 100 microseconds.

In exemplary embodiments, an average delay between a magnetic field measurement and an interference measurement is about 5 nanoseconds (ns) to about 100 µs. In one embodiment, average delay between a magnetic field measurement and an interference measurement is about less than or equal to about 50 µs. In another embodiment, the average delay between a magnetic field measurement and an interference measurement is about less than or equal to about 1 µs. In another embodiment, the average delay between a magnetic field measurement and an interference measurement is about less than or equal to about 10 ns. In yet another embodiment, the average delay between a magnetic field measurement and an interference measurement is about less than or equal to about 5 ns. In yet another embodiment, the magnetic field measurement and an interference measurement are taken simultaneously.

The size of the MEMS current sensor 100 facilitates the sensing of currents in applications where space is limited. The use of MEMS-based components contributes to the reliability of the current sensor 100. Owing, at least in part, to the non-contact sensing methods of sensing current using MEMS current sensors 100, the MEMS current sensor 100 preferably has no impact on the magnitude and/or direction of the current being sensed due to the galvanometric sensing approach taken herein. For example, sensing current using the MEMS current sensor 100 preferably introduces very little error into the current being sensed. Given the dimensions of MEMS-based components and the sensitivity of the same, the MEMS current sensor 100 preferably does not introduce or cause any appreciable variation or change in the current being sensed or measured. Moreover, the MEMS current sensor 100 is advantageous for its reduced cost and significantly reduced size. Further, owing to micro-lithography and micro-fabrication techniques, the fabrication of the MEMS current sensor 100 is advantaged through increased accuracy and precision.

The MEMS-based current sensor 100 operates to sense and determine the current in a first conductor by making use of either the force acting between a conductor carrying an unknown current and a reference current positioned in the magnetic field produced by the unknown current carrying conductor, the mutual inductance induced between terminals of a reference conductor, or the electromotive force induced on a reference conductor with the terminals shorted. A current carrying conductor generates a magnetic field in the vicinity of the current carrying conductor. Additionally, a current carrying conductor placed in the magnetic field generated by a first current carrying conductor will have a force acting on it proportional to the current in the first current carrying conductor. Accordingly, it is possible to sense a current without having to make physical contact with the current carrying conductor. A second conductor placed in the magnetic field generated by the first current carrying conductor will have a mutual induction generated between terminals of the second conductor as governed by the Lenz law. Accordingly, since the magnetic flux due to the first conductor varies in time, there will be a voltage induced between terminals of the second conductor that is proportional to the time rate of change of the flux. Alternatively, if the terminals of the second conductor are shorted, there will be a back electromotive force acting on the second conductor due to mutually inductive coupling.

MEMS-based magnetic field sensors are exposed to a wide variety of environmental factors, which can have an impact on their accuracy. For example, external forces, hereinafter referred to as interference, such as resulting from acceleration and shocks may cause affects that the MEMS-based magnetic field sensor may attribute to being caused by a magnetic field. In accordance with one embodiment, the MEMS-based magnetic field sensors disclosed herein compensate for such external forces by including at least an interference-MEMS component designed to sense interference, in addition to the magneto-MEMS component designed to sense the presence of a magnetic field.

Referring now to FIG. 2, the MEMS magnetic field sensing component 25 senses the magnetic field. In response to the sensing of the magnetic field, the MEMS magnetic field sensing component 25 provides an indication of the current in the first conductor. In an exemplary embodiment, the sensed current indicator includes both a magnitude and direction component regarding the current being sensed. The sensed current indicator can be an electrical indication of the sensed current I.

The illustrated MEMS magnetic field sensing component 25 includes a magneto-MEMS component 30 that, among other things, senses the magnetic field and an interference. As used herein, interference generally refers to any force or extraneous parameter other than a magnetic field that may be interpreted as a magnetic field by the magneto-MEMS 30. In response thereto, the magneto-MEMS component 30 converts the sensed magnetic field and interference to the mechanical indicator of the sensed current I. The MEMS magnetic field sensing component 25 also includes an interference-MEMS component 80 that, among other things, senses only the interference. In response thereto, the interference-MEMS component 80 converts the interference to a mechanical indicator of the sensed interference, also referred to herein as an interference measurand. The MEMS magnetic field sensing component 25 can also include an output component 70, also referred to herein as a readout component, for providing an output indicative of the current I in the first conductor. Output from the output component 70 is preferably an electrical signal indicative and representative of the magnitude and sign of the current I flowing in the first conductor.

The MEMS magnetic field sensing component may also include an excitation source 60 and a controller 65. The excitation means 60 provides excitation quanta (i.e., an amount of excitation energy) for use by the MEMS current sensor 25. The controller 65 controls, for example, a switching and an application of the excitation quanta of the excitation means 60 and the reference signal of the first reference component 50. In another embodiment, the controller 65 selects between differing values of the excitation quanta and a plurality of reference components 50.

A number of exemplary excitation source 60 can be used for the MEMS current sensor. For example, a battery and an AC excitation source 60 can be used. The controller 65 may be used to control the application of the excitation source from the battery and/or the AC source to the MEMS magnetic field sensing component 25, as discussed in regards to FIG. 1. Thus, depending on, for example, the application or context in which the current is being measured, the excitation source 60 can be a DC voltage, an AC voltage, a DC current source, an AC current source or other excitation quanta. Any one or more of the excitation sources 60 may be used in accordance with the MEMS current sensor 25. The excitation source 60 may be, for example, a current source, a voltage source, a resonance generator, or a grounding reference point.

The MEMS magnetic field sensing component 25 includes other components for carrying out the intended functionality thereof. For example, the illustrated magneto-MEMS component 30 includes a magnetic-to-mechanical converter 35 for converting the magnetic representation of the current I (e.g., the magnetic field) to a mechanical change, and a first structural component 40 for providing a structural support and for being responsive to the mechanical change and providing an indication of the mechanical force. The magneto-MEMS component 30 may also include a first mechanical sense component 45 for sensing the mechanical indication provided by first structural component 40, and the first reference component 50 for providing a reference indicator for the mechanical indication to the first structural component 40. The interference-MEMS component 80 includes an interference-to-mechanical converter 85 for converting the sensed interference to a mechanical change. The interference-MEMS component 80 also includes a second structural component 90 for providing a structural support and for being responsive to the mechanical change and providing a indication of the mechanical force. The interference-MEMS component 80 also includes a second mechanical sense component 95 for sensing the mechanical indication provided by the second structural component 90, and a second reference component 51 for providing a reference indicator for the mechanical indication to the second structural component 90.

Generally, a mechanical indicator may be the movement of a structural component that registers, moves, or otherwise indicates the sensing of an external parameter including the magnetic field or interference. In one embodiment, the mechanical indicator is an induced stress on the structural component. In another embodiment, the mechanical indicator includes modification of a mechanical property of the structural component, such as, for example, the spring constant and the mass thereof. The modification of the mechanical property of the structural component will result in the modification of a characteristic response of the structural component. For example, changing the spring constant or weight of the structural component causes the response of the structural component, for example, a deflection or compression of the structural component, to accordingly change. The resonance frequency, for example, can be altered by the modification of the mechanical property. Thus, monitoring and detecting the variance in the response of the first structural component 40 (e.g., resonance frequency) can be used to detect/determine a change in the mechanical property of the first structural component 40. As discussed above, the change in the mechanical property of the first structural component 40 may be caused by the mechanical indicator from the magnetic-to-mechanical converter 35 corresponding to the magnetic field and interference being sensed the magneto-MEMS component 30. Additionally, monitoring and detecting the variance in the response of the second structural component 90 can be used to detect/determine a change in the mechanical property of the second structural component 90. As discussed above, the change in the mechanical property of the second structural component 90 may be caused by the mechanical indicator from the interference-to-mechanical converter 85 corresponding to the interference being sensed.

The first and/or second structural component 40 and/or 90, respectively, may be a supportive material such a membrane, a cantilever, or any number of other structural devices. The mechanical indicator provided by the first and/or second structural component 40 and/or 90, respectively, conveys the vector space value of the mechanical indicator, including one or more of an associated amplitude, direction, speed, and any other characteristic thereof that can be used to convey the vector space value of the mechanical indicator. The mechanical indicator is sensed at the first and/or second mechanical sense component 45 and/or 95, respectively. The sensed mechanical indicator is converted to an interface signal that can be used to further process, interpret, and/or communicate the current sensed by using the generated magnetic field. A first mechanical-to-electrical converter 75 of an output component 70 receives the interface signal from the first mechanical sense component 45 and converts it to a usable electrical signal for interpretation and/or further processing. Likewise, a second mechanical-to-electrical converter 76 of the output component 70 receives the interface signal from the second mechanical sense component 95 and converts it to a usable electrical signal for interpretation and/or further processing.

The output component 70 includes the first mechanical-to-electrical converter 75, the second mechanical-to-electrical converter 76, and an output stage 80. The first mechanical-to-electrical converter 75 receives the mechanical indication provided by the first mechanical sense component 45 and, in turn, provides an electrical indication representative of the sensed current and interference to output stage 80. The second mechanical-to-electrical converter 76 receives the mechanical indication provided by the second mechanical sense component 95 and, in turn, provides an electrical indication representative of the sensed interference to output stage 80. The first and/or second mechanical-to-electrical converter 75 and/or 76 may be based on, for example, a metal strain element, a piezoresistive element, a piezoelectric element, a capacitive element, a tunneling element, or an optical element. Output stage 80 may interface with a memory, an indicator (e.g., a display screen), and/or another device or apparatus for further processing (e.g., a digital signal processor or computer-based analyzer).

The mechanical indicator may be the movement of a first structural component 40 that registers, moves, or otherwise indicates the sensing of the magnetic field. The first structural component 40 may be a membrane, a cantilever, or any number of other structural devices. The detection of the mechanical indicator conveys the actuation of the mechanical indicator, including at least one of an associated amplitude, direction, speed, and any other characteristic thereof that can be used to convey the scope of the mechanical indicator. In one embodiment, the first structural component 40 includes at least one from a group of a membrane, a cantilever, a deflectable membrane, a diaphragm, a flexure member, a cavity, a surface micro-machined structure, a comb structure, and a bridge. The mechanical indicator is sensed at the first mechanical sense component 45. The sensed mechanical indicator is converted to an interface signal that can be used to further process, interpret, and/or communicate the current sensed by using the generated magnetic field. The mechanical-to-electrical converter 75 of an output component 70 takes the interface signal of the mechanical indicator and converts it to a usable electrical signal for interpretation and/or further processing.

Figure 3A:
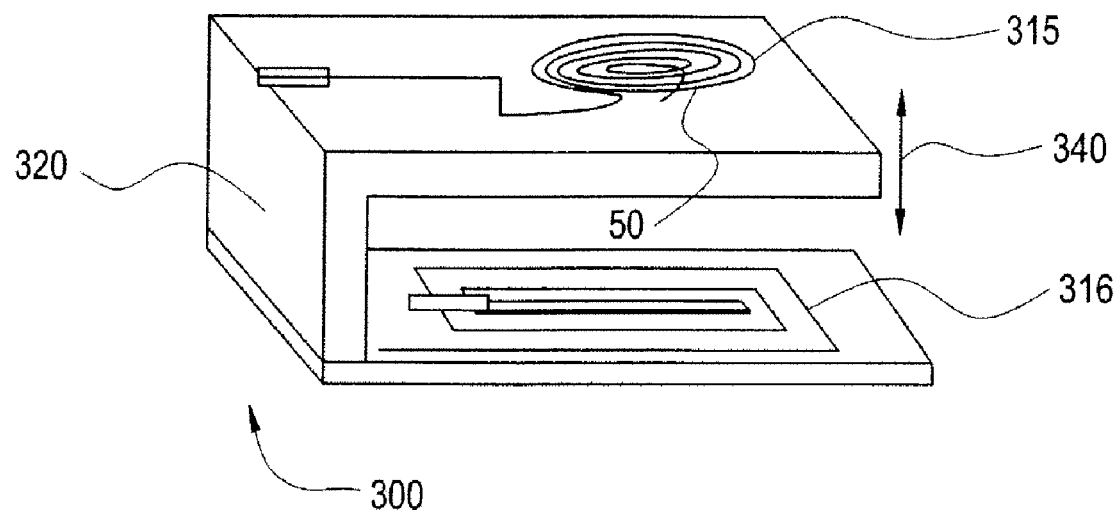
FIGS. 3(a)-(c) illustrate exemplary embodiments of the MEMS-based current sensor as shown in FIG. 1 constructed in accordance with other embodiments.
Figure 3B:
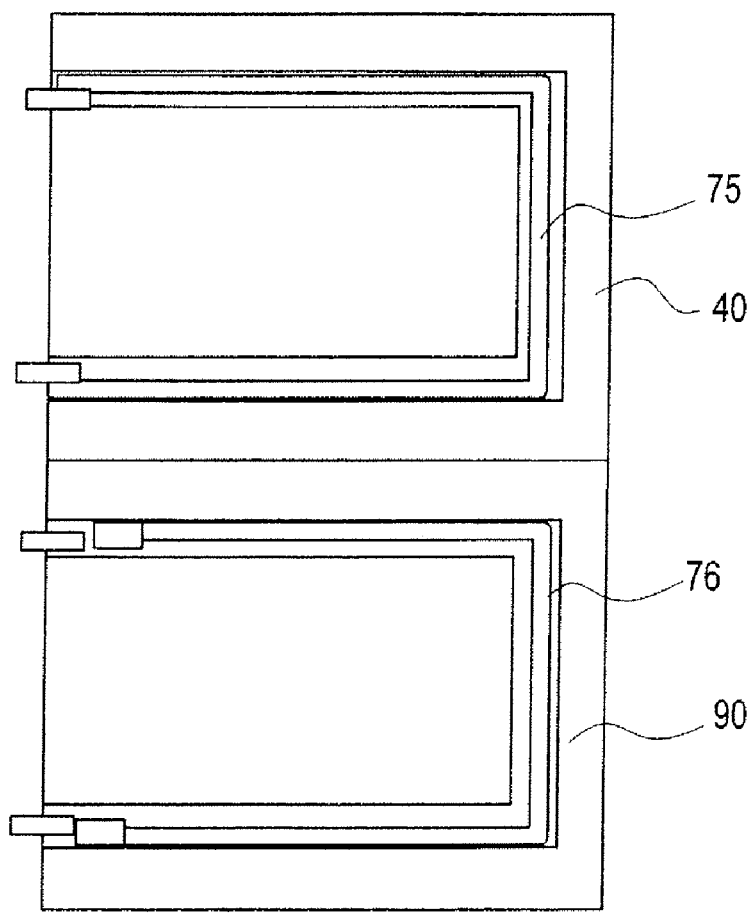
Figure 3C:
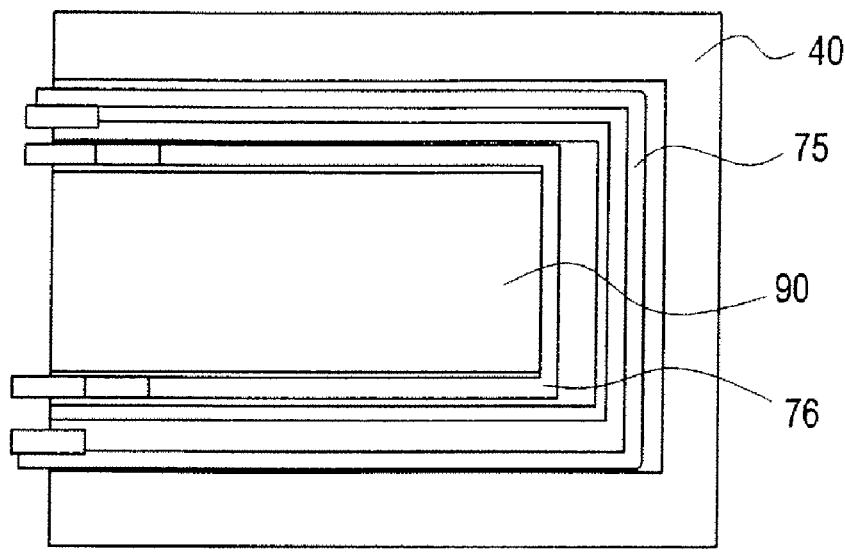

As illustrated in FIG. 3(*a*) an exemplary MEMS device 300 is placed in the vicinity of a first conductor 4 (FIG. 1), in the magnetic field generated by a current I flowing therein. The MEMS device 300 is illustrative, and not limiting, of the types of MEMS devices applicable with the disclosure. That is, the particular MEMS device 300 shown in FIG. 3(*a*) is but one example of the many possible MEMS devices suitable for use in the MEMS based current sensor of the present disclosure.

The MEMS device 300 includes a second conductor 315. In one embodiment, the second conductor 315 is a coil, similar to the magnetic-to-mechanical converter 35 (FIG. 2) disposed on a micro-mechanical structure 320. The micro-mechanical structure 320 is, in the illustrated example, a cantilever having a free end and a supported end. The coil 315 is connected to an excitation source, for example, a current source. The excitation source is preferably controllable by a compensator having a controller (not shown). The controller preferably, at least, controls the application and/or selection of excitation source(s). The controller may be, for example, a switch, an analog processor, a digital signal processor, a digital computing device or an analog-computing device. In the present example, the controller controls at least an on, off, and a value of a bias current supplied to the coil 315. The magnetic field generated by the current I is acted upon and influenced by the bias current supplied to the coil 315. The Lorentz force, due to the interaction of magnetic fields generated by the current I in the first conductor 4 (FIG. 1) and the bias current in the coil 315, causes a mechanical action in the MEMS device 300.

Depending on its polarity, the Lorentz force acts to deflect the cantilever 300 at the free end and supported end thereof in a direction indicated by an arrow 340. Since the cantilever 300 is supported at one end 320, the free end is free to move up or down in response to the Lorentz force acting thereon. The support for the cantilever 300 is located to counteract (i.e., nullify) any deflecting forces acting on the supported end 320 of the cantilever 300. The induced Lorentz force acts along the short ends of the coil 315 (i.e., the ends nearer the free and supported ends of the cantilever 300) based on the geometric configuration of the coil 315 and the bias current. The supported end of the cantilever 300 has a mechanical sense component (not shown) located thereon for sensing the mechanical movement of the cantilever 300. In the example shown, for example, a piezoresistor may be connected to the cantilever 300 to sense the movement thereof that, in turn, imparts a stress on the piezoresistor. The stress on the piezoresistor affects the resistance value of the piezoresistor. The changing resistance of the piezoresistor can be used by the output component 70 to convert from a mechanical to an electrical change, and thus determine the value of the current being sensed. In another exemplary embodiment, a third current carrying conductor 316 (FIG. 3(*a*)) is used to obtain a force balance, active sensing, zero balance sensing, and an equilibrium condition.

The MEMS device 300 depicted in FIG. 3(*a*) can be used to implement the magneto-MEMS component 30 or the interference-MEMS component 80. In one embodiment, in order to measure the magnetic field and interference a base current is applied to the coil 315 and to measure the interference only, no base current is applied to the coil 315. It will be appreciated that the configuration of the MEMS device 300 is only an exemplary embodiment and various other configurations that will be apparent to those skilled in the art may also be used. The MEMS current sensor 25 (FIG. 1) utilizes two MEMS devices 300, one as a magneto-MEMS component 30 and the other as an interference-MEMS component 80. The two MEMS components may be disposed in a variety of different ways.

FIGS. 3(*b*) and (*c*) illustrate exemplary configurations of the magneto-MEMS component 30 and the interference-MEMS component 80. FIG. 3(*b*) illustrates an exemplary configuration wherein the magneto-MEMS component 30 and the other as an interference-MEMS component 80 disposed adjacent to one another. While, FIG. 3(*c*) illustrates an exemplary configuration wherein the magneto-MEMS component 30 and the other as an interference-MEMS component 80 interleaved with each other. Both the magneto-MEMS component 30 and the interference-MEMS component 80 shown in FIGS. 3(*b*) and 3(*c*) may be constructed in a manner similar to the MEMS device 300 depicted in FIG. 3(*a*).

For example, in FIGS. 3(*b*) and (*c*), the first mechanical-to-electrical converter 75 and the second mechanical-to-electrical converter 76 are shown on the first structural component 40 and the second structural component 90, respectively. In this exemplary embodiment, the first mechanical-to-electrical converter 75 and the second mechanical-to-electrical converter 76 include cantilevered coils. The first mechanical-to-electrical converter 75 includes a conductor that is supplied with a bias current while the second mechanical-to-electrical converter 76 includes a conductor that is not supplied with a bias current. The cantilevered coils can deflect due to both magnetic field and interference. In one embodiment, a piezoresistor can be used to detect the magnitude of deflection of the cantilevered coils. The amount of stress placed on the piezoresistor is proportional to the amount of deflection experienced by the deflectable membrane and the magnitude of the current flowing in the first conductor.

Figure 4:
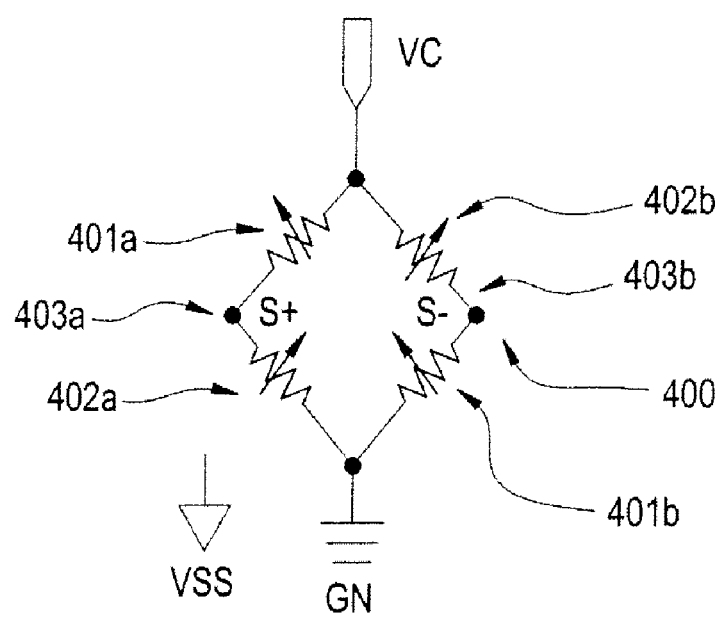
FIG. 4 illustrates an exemplary embodiment of an output component in accordance with one embodiment.

Turning now to FIG. 4, an exemplary embodiment of the output component 70 (FIG. 2) is illustrated. The output stage may be a resistive Wheatstone bridge 400 or a capacitive Wheatstone bridge (not shown). The resistors depicted in the Wheatstone bridge may be piezoresistors as discussed above with reference to FIG. 3. In an exemplary embodiment, the resistive Wheatstone bridge 400 may use the piezoresistive readout from the first mechanical-to-electrical converter 75 and the second mechanical-to-electrical converter 76. For example, two of the diagonal resistors 401*a* and 401*b* shown in the Wheatstone bridge 300 may be the piezoresistor connected to the magneto-MEMS component 30 (FIG. 3(*b*) and FIG. 3(*c*)) while the other two diagonal resistors 402*a* and 402*b* shown may be the piezoresistor connected to the interference-MEMS component 80. In this way, the voltage points S+ and S−, 403*a* and 403*b* respectively, float with the interfering measurand and the differential voltage output of the Wheatstone bridge 400 remains synchronously independent of the interfering measurand, and it depends on the magnetic field or the desired measurand. Thus, the operation of the Wheatstone bridge allows the first mechanical-to-electrical converter 75 and the second mechanical-to-electrical converter 76 to simultaneously measure the interference and magnetic field and to generate an accurate measurement of the magnetic field in the presence of the interference.

Figure 5:
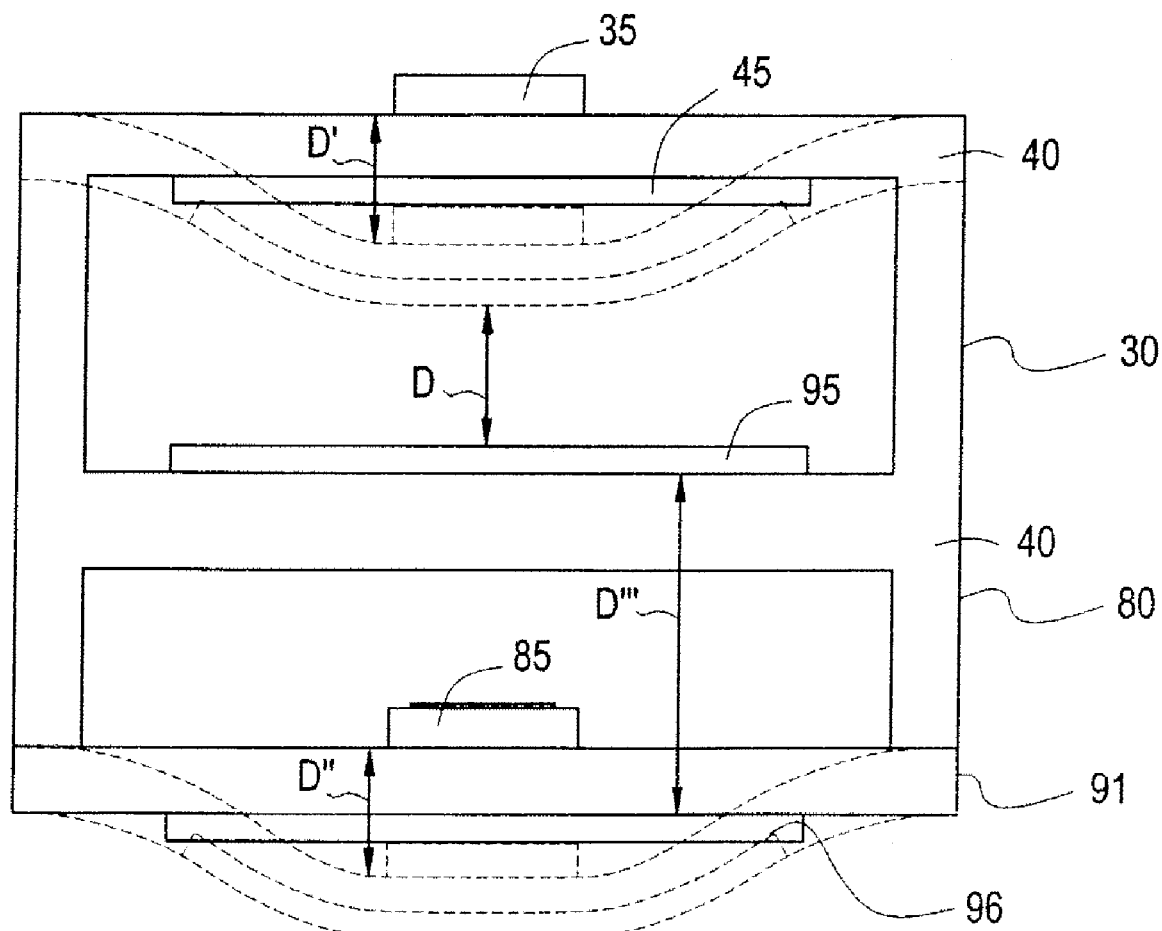
FIG. 5 illustrates a MEMS-based current sensor as shown in FIG. 1 constructed in accordance with another embodiment.

Referring now to FIG. 5, which illustrates an exemplary embodiment of the MEMS current sensor 25. The MEMS current sensor 25 includes both a magneto-MEMS component 30 and an interference-MEMS component 80. During operation of the magneto-MEMS component 30, a voltage differential is applied across the first and second structural components 40 and 90, respectively, causing a capacitance to develop between the first and second mechanical sense components 45 and 95 (thereby causing the sense components to effectively act as plates of a capacitor). Since the capacitance between the first and second sense components 45 and 95 (e.g. plates) is a function of the distance D separating the sense components, a change in distance D will affect a corresponding change in the capacitance. In the illustrated embodiment, a magnetic-to-mechanical converter 35 is in operable communication with the first structural component 40 such that when the magneto-MEMS component 30 is placed in the vicinity of an external current carrying conductor, and a small bias current is flowed in the magnetic-to-mechanical converter 35, the magnetic field generated by the external conductor will exert a force (e.g., Lorentz force) on the magnetic-to-mechanical converter 35. The bias current used can be in the range of microAmps (μA) or milliAmps (mA). However an exemplary bias current might be about 1 to about 10 mA. Moreover, a DC or AC bias current can be used without modification to the capacitive magneto-MEMS component 30. By driving an AC bias current at a frequency that coincides with the resonant frequency of the device, it is possible to further increase sensitivity of the device. As shown in FIG. 5, the Lorentz force will cause the first structural component 40 (e.g. first substrate) to deflect a distance D' thereby decreasing the distance D, and in turn increasing the capacitance, between the first and second mechanical sense components 45 and 95.

Continuing with reference to FIG. 5, during operation of the interference-MEMS component 80, a voltage differential is applied across the second and third structural components 90 and 91, respectively, causing a capacitance to develop between the second and third mechanical sense components 95 and 96, respectively, (thereby causing the sense components to effectively act as plates of a capacitor). Since the capacitance between the second and third sense components (e.g. plates) 95 and 96, respectively, is a function of the distance D''' separating the sense components, a change in distance D''' will affect a corresponding change in the capacitance. In the illustrated embodiment, an interference-to-mechanical converter 85 is in operable communication with the second structural component 90 such that when the interference-MEMS component 80 is placed in the presence of interference, the interference will exert a force (e.g., acceleration) on the interference-to-mechanical converter 85. As shown in FIG. 5, the interference force will cause the third structural component 91 to deflect a distance D" thereby increasing the distance D''', and in turn decreasing the capacitance, between the second and third sense components 95 and 96.

The overall change in capacitance between the first mechanical sense component 45 and the third mechanical sense component 96 is a function of the change in the distance between the two mechanical sense components and is represented by D+D'''. Since a base current is not applied to the interference-to-mechanical converter 85 while a base current is applied to the magnetic-to-mechanical converter 35, the Lorentz force only acts upon the magnetic-to-mechanical converter 35 while both the interference-to-mechanical converter 85 and the magnetic-to-mechanical converter 35 are influenced by interferences forces such as acceleration. Therefore, the change in capacitance between the first mechanical sense component 45 and the third mechanical sense component 96 is indicative of the sensed magnetic field and is insensitive to the sensed interference.

In other exemplary embodiments, the first mechanical sense component 45 may be, for example, a capacitor, a piezoresistor, or an optical sensor. Based on a mechanical change, the capacitor, piezoresistor, and optical sensor can be used to detect and provide an indication of a mechanical change. For example, placing a stress on the piezoresistor will change the resistance thereof. Alternatively, changing the energy exposure of the optical sensor will change a state of the optical sensor, thereby allowing the optical sensor to signal a mechanical change.

In an exemplary embodiment, a transducer may be used to implement the first mechanical sense component 45 to provide an indicator of a detectable measurant (e.g., change in distance between top and bottom electrodes) induced by the magnetic-to-mechanical converter 35 (e.g., the deflectable membrane). The transducer may be used to convert a mechanical measurant (e.g., a displacement, a vibration, a stress, a strain, a torsional stress, a moment, a deflection, a rotation, an elongation, a compression, or the like) into another form or type of signal (e.g., a current, a voltage, a pressure, an optical signal, or the like), that is more readily or conveniently used for further processing and/or output purposes.

As described herein, the need to physically contact a first current carrying conductor 4 to sense the current I is obviated. It is also noted that due to the small dimensions of micro-machined MEMS device (e.g., device 300), the MEMS magnetic field sensing component 25 is itself a dimensionally small device. Accordingly, the change in the magnetic field being sensed by the MEMS magnetic field sensing component 25 at various points on the sensor is very small. The MEMS magnetic field sensing component 25 is therefore accurate since there is no need to compensate for variances across the measuring sensor itself.

In another aspect, due to batch manufacturing techniques of micro-machining and the cost efficiencies therein, the MEMS magnetic field sensing component 25 in accordance with the present disclosure can be manufactured in large batches using micro-machining processes, such as, for example, photo lithography and etching. The manufacture of 10 or 1000 current sensors can be realized for a minimal increase in cost. Also, more than one MEMS device may be manufactured per MEMS-based sensor 25. As noted above, the MEMS device of FIG. 1 is but one example of the current sensors in accordance with the present disclosure. In regard to micro-machining techniques, more than one (i.e., multiple) MEMS device can be included in one MEMS-based sensor 25, thus providing a robust packaging since the multiple MEMS devices may be provided on a common substrate die and packaged therewith. Furthermore, the need for an external interface(s) between the multiple MEMS devices is avoided.

While discussed primarily in the context of using the Lorentz force between the first and second conductors, the magnetic-to-mechanical converter 35 can be modified to use mutual inductance, a moving loop and a magnetic field generated by the first current carrying conductor. Additionally, other characteristic relationships may be used to derive a mechanical indicator of the mechanical indicator corresponding to the current being sensed.

Due at least in part to the use of MEMS technology, the magnetic forces required to operate the MEMS devices are relatively small. The current sensor thus tends to generate relatively little heat. This is advantageous in that there is little heat generated by the current sensors, which may introduce an error in the sensing of the current I. Various actuating MEMS devices and configurations thereof may be used in the MEMS magnetic field sensing component 25 without departing from the scope and spirit of the present disclosure.

While the disclosure has been described with reference to an exemplary embodiment, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

The invention claimed is:

1. A micro-electromechanical system (MEMS) magnetic field sensor comprising:
    a magneto-MEMS component for sensing a magnetic field and a concurrent interference measurand;
    an interference-MEMS component for separately sensing the concurrent interference measurand; and
    a readout component coupled to the magneto-MEMS component and the interference-MEMS component to contemporaneously receive indications of the magnetic field and the interference measurand and to provide an indication of the magnetic field absent the concurrent interference measurand.

2. The MEMS magnetic field sensor of claim 1, wherein the magneto-MEMS component comprises a first mechanical sense component and the interference MEMS component comprises a second mechanical sense component, wherein the magnetic field is sensed based at least in part upon a change experienced by the first and second mechanical sense components.

3. The MEMS magnetic field sensor of claim 2, further comprising:
    a magnetic-to-mechanical converter in operable communication with the first mechanical sense component such that the magnetic-to-mechanical converter exerts a measurable force on the first mechanical sense component when exposed to the magnetic field; and
    an interference-to-mechanical converter in operable communication with the second mechanical sense component such that the interference-to-mechanical converter exerts a measurable force on the second mechanical sense component when exposed to the concurrent interference measurand.

4. The MEMS magnetic field sensor of claim 3, wherein the magnetic-to-mechanical converter comprises a second conductor.

5. The MEMS magnetic field sensor of claim 1, wherein the magneto-MEMS component and the interference-MEMS component comprise:
    a first structural component having a cavity defined therein and a supportive material defined at least partly above the cavity;
    a second structural component in operable communication with the first structural component; and
    a third conductor in operable communication with at least one of the first and second structural components for providing a mechanical indication of the magnetic field.

6. The MEMS current and magnetic field sensor of claim 1, wherein the interference-MEMS component comprises:
    a third structural component having a cavity defined therein and a membrane material disposed at least partly above the cavity;
    a fourth structural component in operable communication with the first structural component; and
    a fourth conductor in operable communication with at least one of the third and fourth structural components for providing a mechanical indication of the interference.

7. The MEMS current and magnetic field sensor of claim 5, wherein the supportive material comprises:
    a cantilever, a deflectable membrane, a diaphragm, or a flexure member.

8. The MEMS current and magnetic field sensor of claim 6, wherein the supportive material comprises:
    a cantilever, a deflectable membrane, a diaphragm, or a flexure member.

9. The micro-electromechanical system (MEMS) current and magnetic field sensor of claim 1, wherein the magneto-MEMS component and the interference-MEMS component are disposed adjacent to one another.

10. The micro-electromechanical system (MEMS) current and magnetic field sensor of claim 1, wherein the magneto-MEMS component and the interference-MEMS component are nested.

11. A micro-electromechanical system (MEMS) current and magnetic field sensor for sensing a magnetic field produced by a current carrying conductor, comprising:
    a first structural component;
    a magnetic-to-mechanical converter in operable communication with the first structural component for providing a mechanical indication of the magnetic field;
    a second structural component;
    an interference-to-mechanical converter in operable communication with the second structural component for providing a mechanical indication of an interference;
    a first mechanical sense component for sensing the mechanical indication from the magnetic-to-mechanical converter;
    a second mechanical sense component for sensing the mechanical indication from the interference-to-mechanical converter; and
    a mechanical change-to-electrical converter in operable communication with the interference-to-mechanical converter and the magnetic-to-mechanical converter for providing an indication of the current in the current carrying conductor.

12. The MEMS current and magnetic field sensor of claim 11, wherein at least one of the first and second structural components comprise a cantilever, a deflectable membrane, a diaphragm, or a flexure member.

13. The MEMS current and magnetic field sensor of claim 11, wherein the first mechanical sense component senses the mechanical indication from the magnetic-to-mechanical converter using a change in a parameter comprising at least one of a capacitance, a resistance, a piezo-resistance, an optical intensity, an optical phase, and a tunneling current.

14. The MEMS current and magnetic field sensor of claim 11, further comprising an output component wherein the output component provides a signal indicative of the current in the conductor.

15. A method of measuring a current in a conductor, comprising:
    measuring a magnetic field and an interference with a magneto-MEMS component;
    generating an first electrical signal indicative of the magnetic field and the interference;
    measuring the interference with a interference MEMS component;
    generating an second electrical signal indicative of the interference; and determining the current in the conductor with an output stage responsive to the first and second electrical signals.

16. The method of claim 15, wherein measuring the interference with the interference MEMS component and measuring the magnetic field and the interference with the magneto-MEMS component is preformed simultaneously.

17. The method of claim 16, wherein an excitation means is used to measure the magnetic field and the interference with the magneto-MEMS component.

18. The method of claim 15, wherein the magneto-MEMS component generates the first electrical signal by using a change in a parameter comprising at least one of a capacitance, a resistance, a piezo-resistance, an optical intensity, an optical phase, and a tunneling current.

19. The method of claim 15, wherein the interference-MEMS component generates the second electrical signal by using a change in a parameter comprising at least one of a capacitance, a resistance, a piezo-resistance, an optical intensity, an optical phase, and a tunneling current.

* * * * *